United States Patent
Wu et al.

(10) Patent No.: US 8,010,065 B2
(45) Date of Patent: Aug. 30, 2011

(54) POWER AMPLIFIER SYSTEM AND CONTROL METHOD AND CONTROL DEVICE THEREOF

(75) Inventors: Ping-Hsun Wu, Kaohsiung (TW); Chang-Ming Lai, Chiayi (TW); Sheng-Feng Lee, Hsinchu (TW); Je-Kuan Jau, Tainan (TW)

(73) Assignee: Industrial Technology Research Institute, Hsinchu (TW)

( * ) Notice: Subject to any disclaimer, the term of this patent is extended or adjusted under 35 U.S.C. 154(b) by 498 days.

(21) Appl. No.: 12/262,198

(22) Filed: Oct. 31, 2008

(65) Prior Publication Data

US 2010/0033244 A1  Feb. 11, 2010

(30) Foreign Application Priority Data

Aug. 7, 2008  (TW) ................ 97130101 A (51) Int. Cl.
    *H04B 1/04* (2006.01)
(52) U.S. Cl. .................... 455/126; 455/127.1
(58) Field of Classification Search .................. 455/126, 455/127.1, 127.3
    See application file for complete search history.

(56) References Cited

U.S. PATENT DOCUMENTS

| | | | |
|---|---|---|---|
| 6,043,707 A | 3/2000 | Budnik | |
| 6,892,057 B2 * | 5/2005 | Nilsson | 455/126 |
| 6,987,417 B2 | 1/2006 | Winter et al. | |
| 7,043,213 B2 | 5/2006 | Robinson et al. | |
| 7,340,228 B2 * | 3/2008 | Monroe et al. | 455/127.1 |
| 7,466,966 B2 * | 12/2008 | Dartois | 455/127.1 |
| 7,907,920 B2 * | 3/2011 | Chan et al. | 455/126 |

* cited by examiner

*Primary Examiner* — Hai L Nguyen
(74) *Attorney, Agent, or Firm* — Jianq Chyun IP Office (57) ABSTRACT

A power amplifier system, a control method thereof, and a control device thereof are provided. The power amplifier system operates in a non-linear switching mode according to an envelope amplitude of an input signal under control of the control device. When the power amplifier is operated in the non-linear switching mode, a supply voltage and an input signal of the power amplifier are provided to the power amplifier by the control device according to pre-measured properties of the power amplifier so as to equip the power amplifier with a high power-added efficiency (PAE) and a better linearity.

20 Claims, 6 Drawing Sheets

POWER AMPLIFIER SYSTEM AND CONTROL METHOD AND CONTROL DEVICE THEREOF

CROSS-REFERENCE TO RELATED APPLICATION

This application claims the priority benefit of Taiwan application serial no. 97130101, filed on Aug. 7, 2008. The entirety of the above-mentioned patent application is hereby incorporated by reference herein and made a part of this specification.

BACKGROUND OF THE INVENTION

1. Field of the Invention

The present invention relates to a power amplifier (PA). More particularly, the present invention relates to a PA having high efficiencies and better linearity.

2. Description of Related Art

The power amplifier (PA) plays an important role in a radio frequency (RF) circuit. The PA is utilized in a transmitter of the RF circuit for amplifying signals to be transmitted. RF characteristics of the PA include linearity of a power output and linearity of an output signal, which can greatly influence a performance of the entire system.

A conventional linear PA system, such as a class-A, a class-B or a class-AB PA system, biases an active device (the PA) thereof by a fixed direct current (DC), so as to obtain better linearity even though efficiency of the conventional PA is poor due to a fall-time DC power consumption. Moreover, when an input power is excessively significant, an output power thereof cannot be linearly amplified, which causes a gain reduction and a signal distortion. At this time, a signal average output power has to be reduced to maintain the linearity, which is referred to as power back-off, so that the PA cannot be operated in a high-efficiency interval, and an average efficiency of the PA is reduced.

A non-linear switching PA, such as a class-D, a class-E or a class-F PA, can theoretically reach 100% efficiency even though the linearity thereof is poor. As such, the non-linear switching PA cannot be applied to a linear modulation system. However, with a developing trend of high-speed for wireless communication systems, demands for signal linearity are increased. Therefore, although the non-linear switching PA has a better efficiency than that of the linear PA, the non-linear PA still cannot be solely applied to the high-linearity modulation system due to a poor linearity of the non-linear PA. Instead, the non-linear PA has to be utilized together with other devices to form an amplifier system for practicality.

For example, a PA system providing mode switching that is respectively disclosed in U.S. Pat. No. 6,043,707, U.S. Pat. No. 6,987,417, and U.S. Pat. No. 7,043,213 can be switched to different operation modes according to different power regions, so as to improve system efficiencies and the linearity. However, compared to the conventional linear PA, efficiency improvement of these PA systems under middle-low output power is limited.

SUMMARY OF THE INVENTION

The present invention is directed to a control device and a control method for a power amplifier (PA) system, which can pre-process an input signal to improve efficiencies of the PA and maintain high linearity.

The present invention provides a control device of a PA, which includes a mode selection module, a parameter providing module, a waveform adjusting module, a power voltage generation module and a bias generation module. The mode selection module is used for receiving an input signal and outputting a mode signal according to a comparison result between an envelope amplitude of the input signal and a threshold value. The parameter providing module is used for providing a supply voltage parameter and a PA input power parameter. The waveform adjusting module is coupled to the mode selection module and the parameter providing module for receiving the input signal and outputting a PA input signal to an input terminal of the PA, wherein when the mode signal is in a first mode, the waveform adjusting module obtains the PA input power parameter from the parameter providing module according to the envelope amplitude of the input signal and outputs the PA input signal according to the PA input power parameter and the input signal. The power voltage generation module is coupled to the mode selection module and the parameter providing module for outputting a supply voltage to a power terminal of the PA. The power voltage generation module obtains the supply voltage parameter from the parameter providing module according to the envelope amplitude of the input signal when the mode signal is in the first mode, so as to set the supply voltage. The bias generation module is coupled to the mode selection module for outputting an amplifier bias to a bias terminal of the PA. The bias generation module sets the amplifier bias to be a first predetermined bias when the mode signal is in the first mode.

The present invention further provides a PA system including a PA and the aforementioned control device. The PA input signal output from the waveform adjusting module of the control device is used for driving the PA. The power terminal of the PA is operated according to an output signal of the power voltage generation module. The bias terminal of the PA is operated according to an output signal of the bias generation module.

The present invention further provides a control method for a PA. The control method includes following steps. First, a parameter providing module is provided for providing a supply voltage parameter and a PA input power parameter. Next, an input signal is provided. Next, an envelope amplitude of the input signal and a threshold value are compared, wherein when the envelope amplitude of the input signal is greater than the threshold value, the PA input power parameter is obtained from the parameter providing module according to the envelope amplitude of the input signal, and a PA input signal is obtained by calculating the PA input power parameter and the input signal, and then the PA input signal is output to an input terminal of the PA. The supply voltage parameter is obtained from the parameter providing module according to the envelope amplitude of the input signal, and a supply voltage is output to a power terminal of the PA according to the supply voltage parameter. An amplifier bias is set as a first predetermined bias, and the amplifier bias is output to a bias terminal of the PA.

In summary, according to the control device and the control method of the PA system provided by the present invention, properties of the PA are pre-measured, and a measurement result is converted into an optimal PA supply voltage parameter and the PA input power parameter, and the parameters are stored in the parameter providing module. During utilization of the PA, the suitable supply voltage and the PA input signal can be obtained according to the input signal, so as to improve efficiencies and linearity of the PA.

In order to make the aforementioned and other features and advantages of the present invention comprehensible, embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

The accompanying drawings are included to provide a further understanding of the invention, and are incorporated in and constitute a part of this specification. The drawings illustrate embodiments of the invention and, together with the description, serve to explain the principles of the invention.

In order to make the aforementioned and other features and advantages of the present invention comprehensible, embodiments accompanied with figures are described in detail below. Under any possible situations, like reference numerals in the drawings denote like elements.

Figure 1:
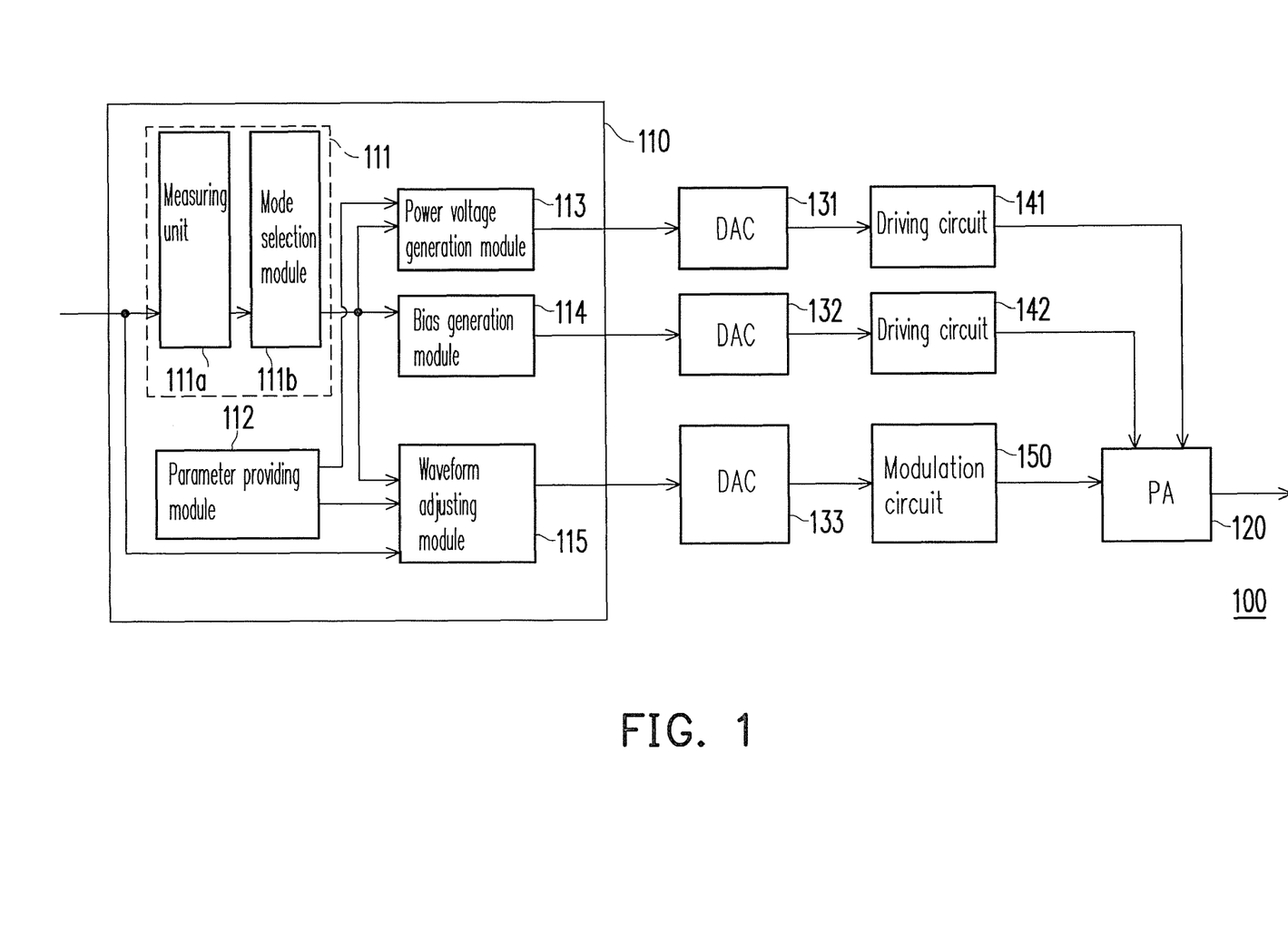
FIG. 1 is a schematic diagram illustrating a PA system according to an embodiment of the present invention.

FIG. 1 is a schematic diagram illustrating a PA system according to an embodiment of the present invention. Referring to FIG. 1, the PA system 100 includes a control device 110, a PA 120, driving circuits 141 and 142, and a modulation circuit 150. The control device 110 is coupled to the PA 120 via the driving circuits 141 and 142 and the modulation circuit 150. In the present embodiment, the control device 110 is, for example, a digital signal processor. Therefore, the PA system 100 can further include digital-to-analog converters (DACs) 131~133, so that before the control device 110 is coupled to the driving circuits 141 and 142 and the modulation circuit 150, digital signals thereof can be converted into analog signals via the DACs 131~133. Here, the PA 120 is, for example, a class-E PA.

The control device 110 further includes a mode selection module 111, a parameter providing module 112, a power voltage generation module 113, a bias generation module 114 and a waveform adjusting module 115. The mode selection module 111 further includes a measuring unit 111a and a mode selection unit 111b coupled to the measuring unit 111a. The mode selection unit 111b is coupled to the power voltage generation module 113, the bias generation module 114 and the waveform adjusting module 115. The parameter providing module 112 is coupled to the power voltage generation module 113 and the waveform adjusting module 115. The measuring unit 111a and the waveform adjusting module 115 commonly receive an input signal.

As described above, the measuring unit 111a receives the input signal and measures and converts an envelope amplitude of the input signal into a voltage amplitude for outputting the voltage amplitude to the mode selection unit 111b.

Next, the mode selection unit 111b calculates a power of a pending output signal of the PA system 100 according to the measured voltage amplitude. Since the power of the pending output signal is in direct proportion to the voltage amplitude, a mode signal can be output by comparing the voltage amplitude with a threshold value, so as to determine an operation mode of the PA system 100. Thereby, a maximum efficiency and linearity of the PA 120 can be achieved. In other words, either the voltage amplitude or the power of the pending output signal can be utilized for comparison or judgement according to an actual requirement to obtain the same effect. When the voltage amplitude is greater than the threshold value, the mode selection unit 111b determines that it is a high power output, sets the mode signal to be in a first mode, and outputs the power of the pending output signal. As such, the PA 120 can maintain better linearity and efficiencies while amplifying a high power signal.

Moreover, the PA 120 can also amplify a low power signal. For example, when the voltage amplitude is less than the threshold value, the mode selection unit 111b determines that it is a low power output, sets the mode signal into a second mode, and outputs the power of the pending output signal. If the voltage amplitude is equal to the threshold value, the low power output or the high power output can be determined according to an actual requirement, which is not limited by the present invention.

If it is determined to be the high power output, namely, when the voltage amplitude is greater than the threshold value, the mode selection unit 111b sets the mode signal to be in the first mode, and the power voltage generation module 113 obtains a supply voltage parameter from the parameter providing module 112 according to the power of the pending output signal, and outputs a supply voltage according to the supply voltage parameter. The DAC 131 then converts the supply voltage into an analog signal, and the driving circuit 141 amplifies the supply voltage and transmits it to a power terminal of the PA 120.

The bias generation module 114 sets an amplifier bias to be a first predetermined bias and outputs the amplifier bias to the DAC 132. The DAC 132 converts the amplifier bias into an analog signal and outputs it to the driving circuit 142. The driving circuit 142 then amplifies the amplifier bias and transmits it to a bias terminal of the PA 120. By such means, the voltage at the bias terminal of the PA 120 can be changed, so that the PA 120 can be operated under a non-linear switching mode. The bias terminal of the PA is, for example, a base or a gate.

Meanwhile, the waveform adjusting module 115 obtains a PA input power parameter from the parameter providing module 112 according to the power of the pending output signal and obtains a PA input signal according to the PA input power parameter and the input signal. The PA input signal is then output to an input terminal of the DAC 133. The modulation circuit 150 then modulates the PA input signal into a radio frequency signal and outputs it to the input terminal of the PA 120.

As described above, if it is determined to be the low power output, namely, when the voltage amplitude is less than the threshold value, the mode selection unit 111b sets the mode signal to be in a second mode, and the power voltage generation module 113 sets the supply voltage to be a first predetermined supply value. The DAC 131 then converts the supply voltage into an analog signal, and the driving circuit 141 amplifies the supply voltage and transmits it to the power terminal of the PA 120. Here, the first predetermined supply value is, for example, the threshold value.

At this time, the bias generation module 114 sets the amplifier bias to be a second predetermined bias and outputs the amplifier bias to the DAC 132. The DAC 132 converts the amplifier bias into an analog signal and outputs it to the driving circuit 142. The driving circuit 142 amplifies the amplifier bias and outputs it to the bias terminal of the PA 120. By such means, the voltage at the bias terminal of the PA 120 can be changed, so that the PA 120 can be operated under a linear mode.

Meanwhile, the waveform adjusting module 115 outputs the PA input signal to the input terminal of the DAC 133 according to a magnification of the PA 120. In other words, the PA input signal is adjusted so that the power of the PA input signal is equal to the power of the pending output signal divided by a linear gain obtained when the PA 120 is operated in the linear interval. The PA input signal is then output to the DAC 133 for analog conversion. Thereafter, the modulation circuit 150 modulates the PA input signal into a radio frequency signal and outputs it to the input terminal of the PA 120.

The parameter providing module 112 includes a voltage comparison table and a power comparison table. The voltage comparison table stores a plurality of supply voltage parameters and is used for obtaining the supply voltage parameter according to the power of the pending output signal. The power comparison table stores a plurality of PA input power parameters and is used for obtaining the PA input power parameter according to the power of the pending output signal. Moreover, as described above, the voltage amplitude can be utilized for replacing the power of the pending output signal as a basis of determination according to an actual requirement.

Moreover, in another embodiment, the parameter providing module 112 includes a first formula parameter storage unit and a second formula parameter storage unit. The first formula parameter storage unit is used for outputting the supply voltage parameter according to the power of the pending output signal, and the second formula parameter storage unit is used for outputting the PA input power parameter according to the power of the pending output signal. The power voltage generation module 113 calculates and outputs the supply voltage according to the supply voltage parameter, and the waveform adjusting module 115 calculates and obtains the PA input signal according to the PA input power parameter and the input signal, and the waveform adjusting module 115 then outputs the PA input signal to the input terminal of the PA 120. Moreover, as described above, the voltage amplitude can be utilized for replacing the power of the pending output signal as a basis of determination according to an actual requirement.

Figure 2:
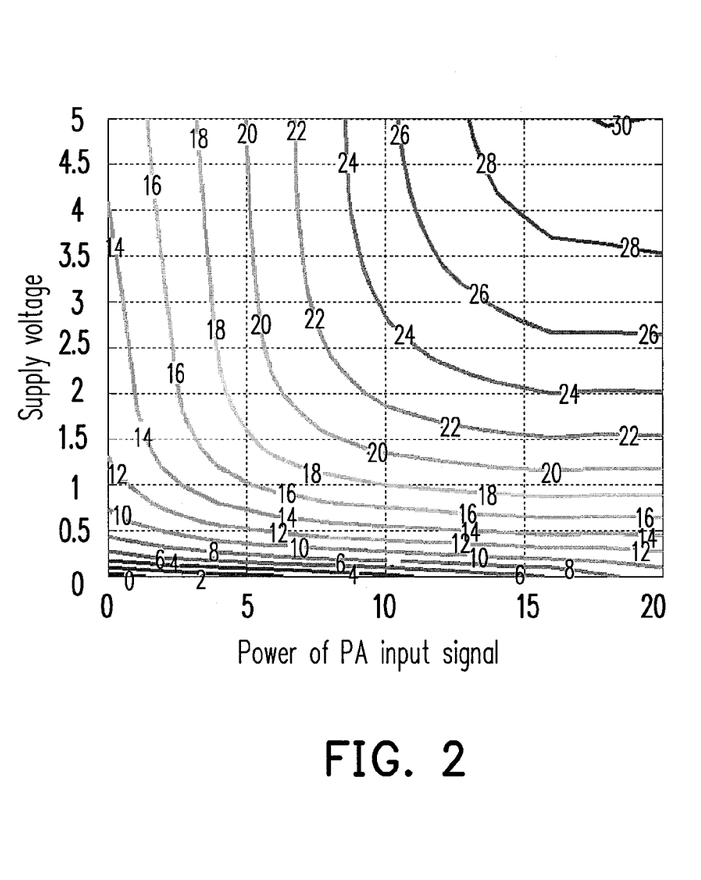
FIG. 2 is a schematic diagram illustrating a three-dimensional correlation among powers of a PA input signal, supply voltages and powers of a pending output signal according to an embodiment of the present invention.
Figure 3:
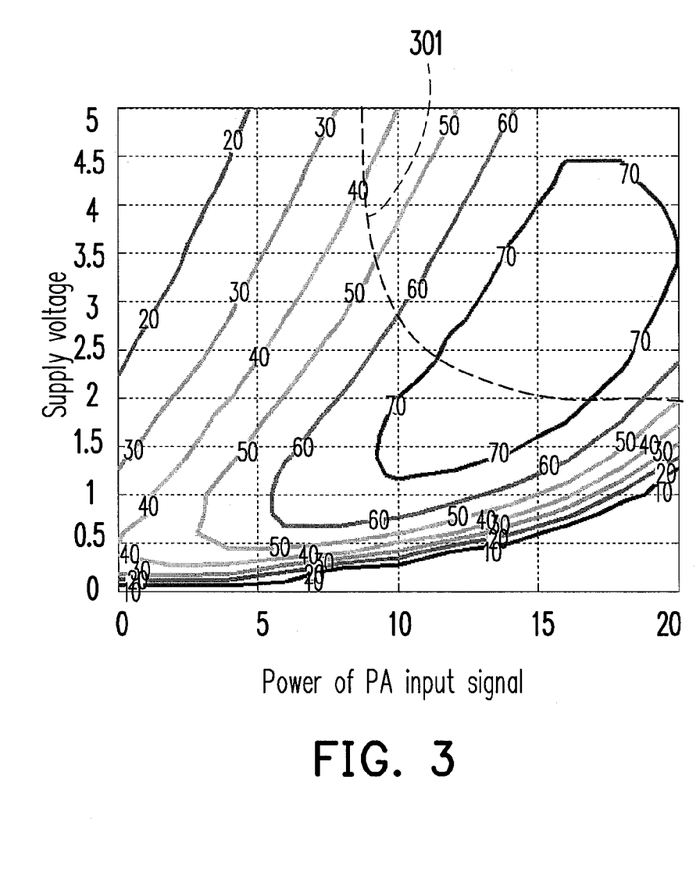
FIG. 3 is a schematic diagram illustrating a three-dimensional correlation among powers of a PA input signal, supply voltages and power-added efficiencies (PAE) according to an embodiment of the present invention.

To elaborate the way to obtain the parameter providing module 112, please refer to FIG. 2 and FIG. 3. FIG. 2 is a schematic diagram illustrating a three-dimensional correlation among powers of a PA input signal, supply voltages and powers of a pending output signal according to an embodiment of the present invention. FIG. 3 is a schematic diagram illustrating a three-dimensional correlation among powers of a PA input signal, supply voltages and power-added efficiencies (PAE) according to an embodiment of the present invention. Before the PA 120 is utilized, powers of the pending output signal and the PAEs correspondingly generated by the PA 120 under different supply voltages and different powers of the PA input signal are measured first. In FIG. 2, each equipotential line represents the power of the same pending output signal and corresponds to a different power of the PA input signal and a different supply voltage. Similarly, each equipotential line of FIG. 3 represents the same PAE and corresponds to a different power of the PA input signal and a different supply voltage.

As described above, after the control device 110 receives the input signal, the mode selection unit 111b first calculates the power of the pending output signal. To determine which set of the power of the PA input signal and the supply voltage may have the maximum PAE, FIG. 2 and FIG. 3 can then be relied on. For example, when the power of the pending output signal calculated by the mode selection unit 111b is 24 dBm, the equipotential line corresponding to the power of the pending output signal of 24 dBm is then found from FIG. 2. For the sake of simplicity, the equipotential line corresponding to the power of the pending output signal of 24 dBm of FIG. 2 is overlapped to a corresponding dot line 301 in FIG. 3. A combination of the power of the PA input signal and the supply voltage corresponding to the optimal PAE is then found from FIG. 3 along the dot line 301. In other words, after the mode selection unit 111b calculates the power of the pending output signal, the combination of the power of the PA input signal and the supply voltage corresponding to the optimal PAE then can be determined.

The above result obtain by looking up FIG. 2 and FIG. 3 can be stored into the power comparison table and the voltage comparison table, so that the supply voltage parameter or the PA input power parameter can be directly obtained via looking up the tables. Alternatively, the above lookup results can be stored into the first formula parameter storage unit and the second formula parameter storage unit in the form of formula, so that the supply voltage parameter or the PA input power parameter can be obtained via calculation.

Figure 4:
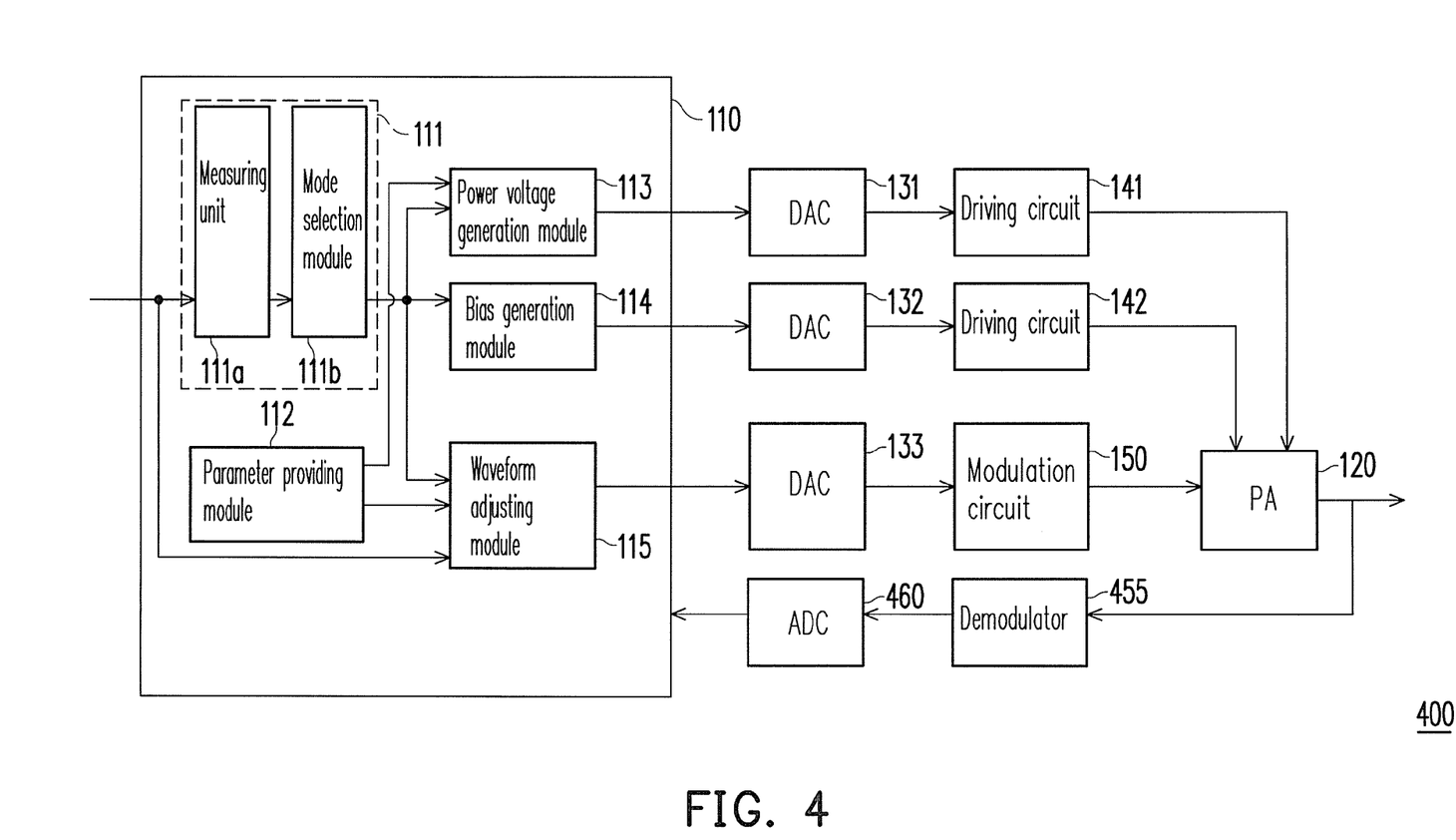
FIG. 4 is a schematic block diagram illustrating an amplifier system according to another embodiment of the present invention.

Moreover, to optimize different communication systems, in the present embodiment, the control device 110 is programmable, in which the threshold value, the predetermined supply bias, and the supply voltage parameter or the PA input power parameter in the parameter providing module can be changed and can be applied to an adaptive signal processing technique. Thereby, the threshold value can be modified by comparing a feedback signal with the input signal, and an algorithm thereof can be adjusted according to different environments and systems, as shown in FIG. 4. FIG. 4 is a schematic block diagram illustrating an amplifier system according to another embodiment of the present invention. A PA system 400 of FIG. 4 has functions similar to those of the PA system 100 of FIG. 1, and a main difference therebetween is that the PA system 400 further includes a demodulator 455 and an analog-to-digital converter (ADC) 460. The demodulator 455 demodulates an output signal of the PA system 400 into a feedback signal. The ADC 460 then converts the feedback signal into a digital signal and transmits it back to the control device 110 for processing, so as to correspondingly change the threshold value, the predetermined supply bias, and the supply voltage parameter or the PA input power parameter in the parameter providing module of the control device 110.

Figure 5:
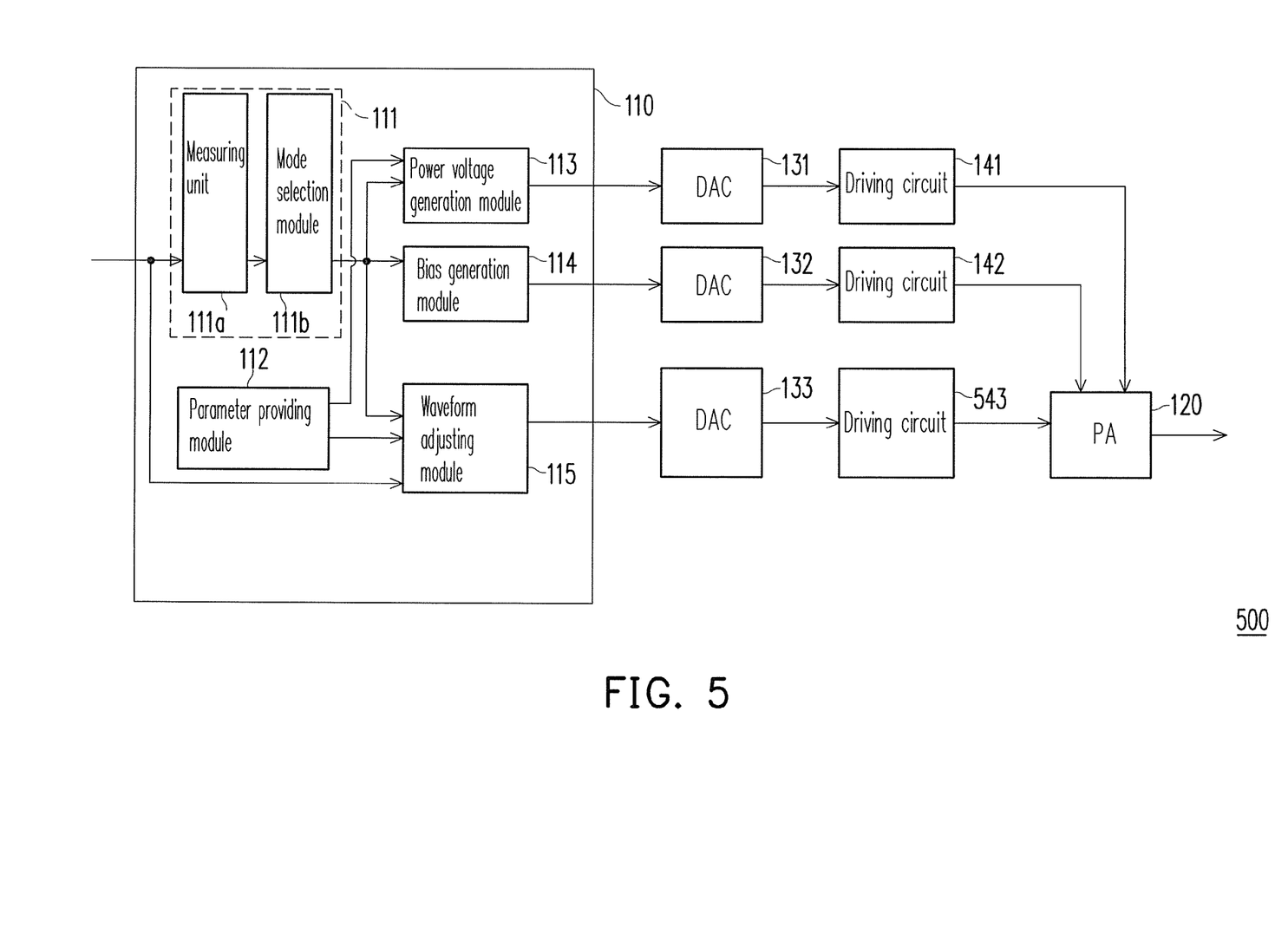
FIG. 5 is a schematic block diagram illustrating an amplifier system according to still another embodiment of the present invention.

Moreover, the present invention further provides still another embodiment as shown in FIG. 5 which is a schematic block diagram illustrating an amplifier system according to still another embodiment of the present invention. A PA system 500 of FIG. 5 has functions similar to those of the PA system 100 of FIG. 1, and a main difference therebetween is that the waveform adjusting module 115 can directly output the radio frequency signal, so that the modulation circuit 150 is not required for modulating the PA input signal. Therefore, in the PA system 500, a driving circuit 543 can be utilized to amplify signals.

Figure 6:
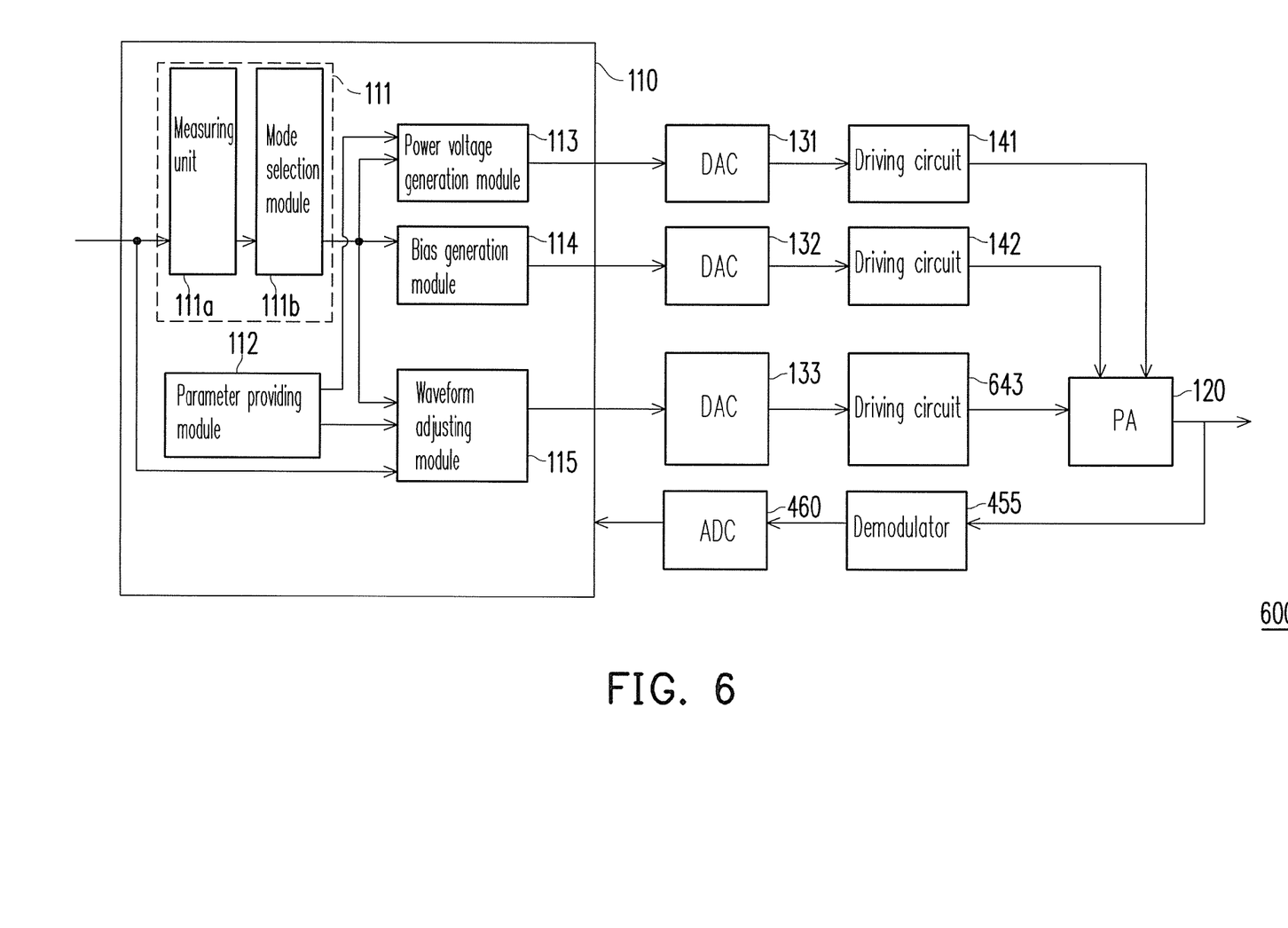
FIG. 6 is a schematic block diagram illustrating an amplifier system according to yet another embodiment of the present invention.

Moreover, the present invention provides yet still another embodiment as shown in FIG. 6 which is a schematic block diagram illustrating an amplifier system according to yet another embodiment of the present invention. A PA system 600 of FIG. 6 has functions similar to those of the PA system 400 of FIG. 4, and a main difference therebetween is that the waveform adjusting module 115 can directly output the radio frequency signal, so that the modulation circuit 150 is not required for modulating the PA input signal. Therefore, in the PA system 600, a driving circuit 643 can be utilized to amplify signals. In other words, the PA system 600 simultaneously has the feedback signal, and the waveform adjusting module 115 of the PA system 600 can directly output the radio frequency signal.

Figure 7:
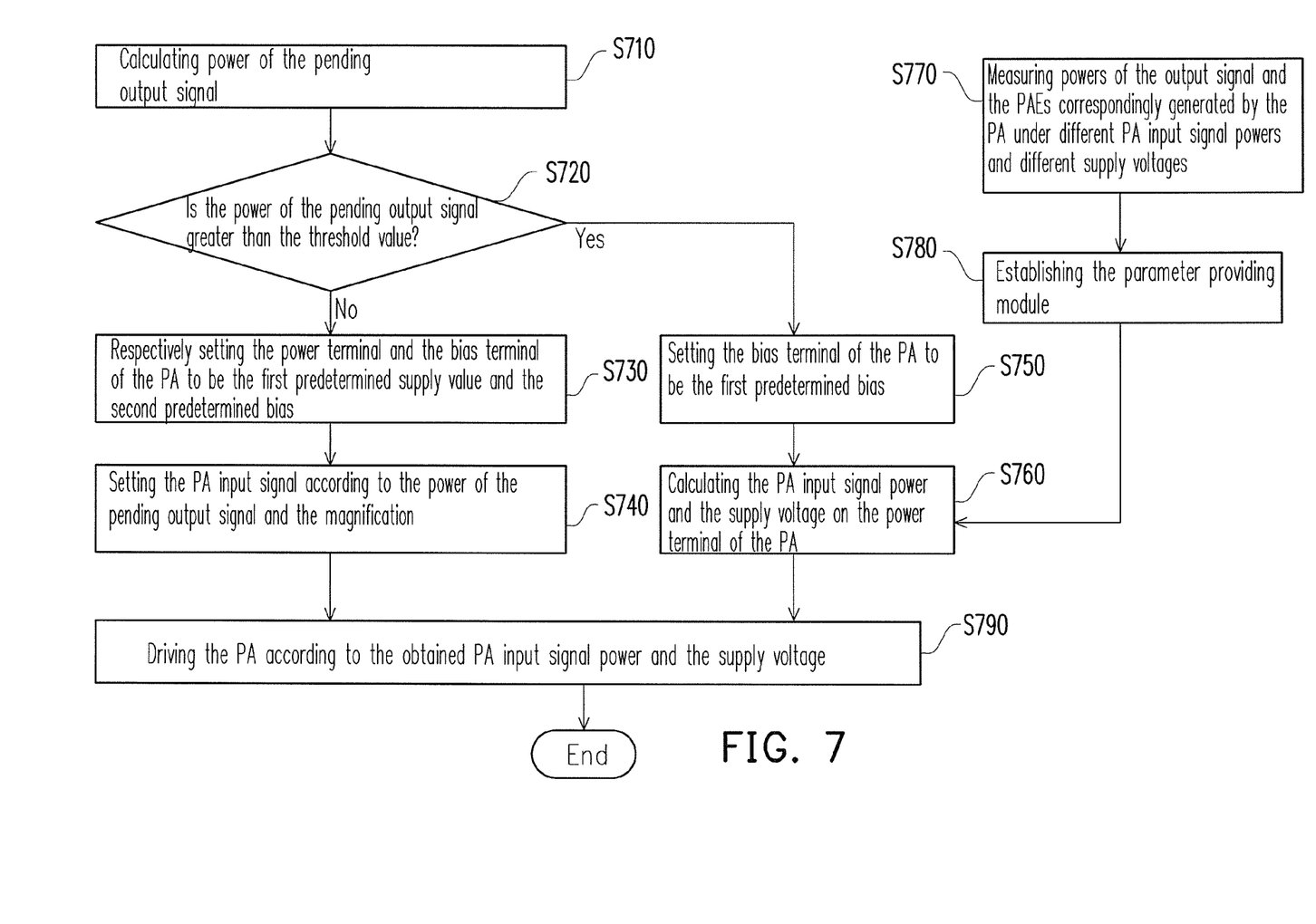
FIG. 7 is a flowchart illustrating a control method of a PA according to an embodiment of the present invention.

According to the aforementioned disclosure, a control method of a PA is provided hereinafter for those skilled in the art. FIG. 7 is a flowchart illustrating a control method of a PA according to an embodiment of the present invention. Referring to FIG. 7, the control method of the PA includes following steps. First, before the PA is utilized, powers of the output signal and the PAEs correspondingly generated by the PA under different PA input signal and different supply voltages are pre-measured (step S770). According to the pre-measurement result, in case the power of the output signal is known, the power of the output signal and the PAE corresponding to each power of the PA input signal and each of the supply voltages can be obtained, so that the parameter providing module can be established according to such corresponding correlation (step S780), wherein the parameter providing module can be implemented in the form of the comparison table or the comparison formula for providing the PA input power parameter and the supply voltage parameter. After the pre-operations are completed, operation of the PA is started.

First, the power of the pending output signal is calculated (step S710) by measuring an envelope amplitude of the input signal. Next, whether the power of the pending output signal is greater than the threshold value is determined (step S720). As described above, the voltage amplitude can be utilized for replacing the power of the pending output signal as a basis of the determination according to an actual requirement. It should be noted that in the present embodiment, the threshold value is represented by power, and if the power of the pending output signal is replaced by the voltage amplitude, the threshold value is first converted to be represented by voltage.

When the power of the pending output signal is less than or equal to the threshold value, the power terminal and the bias terminal of the PA are respectively set to be the first predetermined supply value and the second predetermined bias (step S730), so that the PA can be operated in the linear mode. Next, the PA input signal is set according to the power of the pending output signal and the magnification (step S740), and the magnification is the linear gain of the PA.

When the power of the pending output signal is greater than the threshold value, the bias terminal of the PA is set to be the first predetermined bias (step S750), so that the PA can be set to be in the non-linear switching mode. Next, the power of the PA input signal and the supply voltage on the power terminal of the PA are calculated (step S760), which can be calculated according to the power of the pending output signal and the PA input power parameter and the supply voltage parameter of the parameter providing module established in the step S780.

Finally, the PA is driven by the obtained PA input signal power and the supply voltage (step S790), and a high linearity and high efficiency of the PA can be achieved.

In summary, according to the control device and the control method of the PA system provided by the present invention, the properties of the PA are pre-measured, and the measurement result is stored in the parameter providing module. During utilization of the PA, the suitable supply voltage and the power of the PA input signal can be obtained according to the input signal, so as to improve the efficiency and the linearity of the PA. Moreover, optimization of the PA can be performed in different systems in order to comply with standards of various wireless communication systems.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A control device of a power amplifier (PA), comprising:
 a mode selection module, for receiving an input signal and outputting a mode signal according to a comparison result between an envelope amplitude of the input signal and a threshold value;
 a parameter providing module, for providing a supply voltage parameter and a PA input power parameter;
 a waveform adjusting module, coupled to the mode selection module and the parameter providing module to receive the input signal and outputting a PA input signal to an input terminal of the PA, wherein when the mode signal is in a first mode, the waveform adjusting module obtains the PA input power parameter from the parameter providing module according to the envelope amplitude of the input signal and outputs the PA input signal according to the PA input power parameter and the input signal;
 a power voltage generation module, coupled to the mode selection module and the parameter providing module for outputting a supply voltage to a power terminal of the PA, and obtaining the supply voltage parameter from the parameter providing module according to the envelope amplitude of the input signal when the mode signal is in the first mode, so as to set the supply voltage; and
 a bias generation module, coupled to the mode selection module for outputting an amplifier bias to a bias terminal of the PA, and setting the amplifier bias to be a first predetermined bias according to the mode signal when the mode signal is in the first mode.

2. The control device as claimed in claim 1, wherein the parameter providing module comprises:
 a voltage comparison table, for storing a plurality of supply voltage parameters, and for obtaining the supply voltage parameter according to the envelope amplitude of the input signal; and
 a power comparison table, for storing a plurality of PA input power parameters, and for obtaining the PA input power parameter according to the envelope amplitude of the input signal.

3. The control device as claimed in claim 1, wherein the parameter providing module comprises:

a first formula parameter storage unit, for outputting the supply voltage parameter according to the envelope amplitude of the input signal; and a second formula parameter storage unit, for outputting the PA input power parameter according to the envelope amplitude of the input signal, wherein the waveform adjusting module calculates and obtains the PA input signal according to the PA input power parameter and the input signal, and the power voltage generation module calculates and outputs the supply voltage according to the supply voltage parameter.

4. The control device as claimed in claim 1, wherein the mode selection module comprises:

a measuring unit, for measuring the envelope amplitude of the input signal and outputting a voltage amplitude; and a mode selection unit, for comparing the voltage amplitude with the threshold value, wherein when the voltage amplitude is greater than the threshold value, the mode selection unit sets the mode signal to be in the first mode.

5. The control device as claimed in claim 4, wherein the mode signal is set to be in a second mode when the voltage amplitude is less than the threshold value, the waveform adjusting module outputs the PA input signal according to a magnification, the power voltage generation module sets the supply voltage to be a first predetermined supply value, and the bias generation module sets the amplifier bias to be a second predetermined bias.

6. The control device as claimed in claim 5, wherein the first predetermined supply value is the threshold value.

7. A PA system, comprising:

a control device, comprising:

a mode selection module, for receiving an input signal and outputting a mode signal according to a comparison result between an envelope amplitude of the input signal and a threshold value:

a parameter providing module, for providing a supply voltage parameter and a PA input power parameter;

a waveform adjusting module, coupled to the mode selection module and the parameter providing module to receive the input signal and outputting a PA input signal to an input terminal of the PA, wherein when the mode signal is in a first mode, the waveform adjusting module obtains the PA input power parameter from the parameter providing module according to the envelope amplitude of the input signal and outputs the PA input signal according to the PA input power parameter and the input signal;

a power voltage generation module, coupled to the mode selection module and the parameter providing module for outputting a supply voltage to a power terminal of the PA, and obtaining the supply voltage parameter from the parameter providing module according to the envelope amplitude of the input signal when the mode signal is in the first mode, so as to set the supply voltage; and a bias generation module, coupled to the mode selection module for outputting an amplifier bias to a bias terminal of the PA, and setting the amplifier bias to be a first predetermined bias according to the mode signal when the mode signal is in the first mode; and a PA, having an input terminal operated in response to the PA input signal, a power terminal operated in response to the supply voltage, and a bias terminal operated in response to the amplifier bias.

8. The PA system as claimed in claim 7, further comprising a modulation circuit coupled between the input terminal of the PA and the waveform adjusting module for modulating output signals of the waveform adjusting module.

9. The PA system as claimed in claim 7, wherein the control device is a digital system.

10. The PA system as claimed in claim 9, further comprising:

a first digital-to-analog converter, coupled between the power voltage generation module and a first driving circuit;

a second digital-to-analog converter, coupled between the bias generation module and a second driving circuit; and a third digital-to-analog converter, coupled between the waveform adjusting module and the modulation circuit.

11. The PA system as claimed in claim 7, wherein the parameter providing module comprises:

a voltage comparison table, for storing a plurality of supply voltage parameters, and for obtaining the supply voltage parameter according to the envelope amplitude of the input signal; and a power comparison table, for storing a plurality of PA input power parameters, and for obtaining the PA input power parameter according to the envelope amplitude of the input signal.

12. The PA system as claimed in claim 7, wherein the parameter providing module comprises:

a first formula parameter storage unit, for outputting the supply voltage parameter according to the envelope amplitude of the input signal; and a second formula parameter storage unit, for outputting the PA input power parameter according to the envelope amplitude of the input signal, wherein the waveform adjusting module calculates and obtains the PA input signal according to the PA input power parameter and the input signal, and the power voltage generation module calculates and outputs the supply voltage according to the supply voltage parameter.

13. The PA system as claimed in claim 7, wherein the mode selection module comprises:

a measuring unit, for measuring the envelope amplitude of the input signal and outputting a voltage amplitude; and a mode selection unit, for comparing the voltage amplitude with the threshold value, wherein when the voltage amplitude is greater than the threshold value, the mode selection unit sets the mode signal to be in the first mode.

14. The PA system as claimed in claim 13, wherein the mode signal is set to be in a second mode when the voltage amplitude is less than the threshold value, the waveform adjusting module outputs the PA input signal according to a magnification, the power voltage generation module sets the supply voltage to be a first predetermined supply value, and the bias generation module sets the amplifier bias to be a second predetermined bias.

15. The PA system as claimed in claim 14, wherein the first predetermined supply value is the threshold value.

16. A control method for a PA, the control method comprising:

providing a parameter providing module, for providing a supply voltage parameter and a PA input power parameter;

comparing an envelope amplitude of an input signal with a threshold value; and when the envelope amplitude of the input signal is greater than the threshold value, obtaining the PA input power parameter from the parameter providing module according to the envelope amplitude of the input signal, calculating and obtaining a PA input signal according to the PA input power parameter and the input signal, and outputting the PA input signal to an input terminal of the PA;

obtaining the supply voltage parameter from the parameter providing module according to the envelope amplitude of the input signal, and outputting a supply voltage to a power terminal of the PA according to the supply voltage parameter; and setting a bias terminal of the PA to be a first predetermined bias.

17. The control method as claimed in claim 16, wherein steps of providing the parameter providing module for providing the supply voltage parameter and the PA input power parameter comprise:

measuring a plurality of output powers and a plurality of output efficiencies of the PA corresponding to various power voltages and the envelope amplitudes of various input signals;

obtaining a comparison table according to the power voltages, the envelope amplitudes of the input signals, the output powers and the output efficiencies; and finding a reference voltage and a reference power from the comparison table according to the envelope amplitude of the input signal.

18. The control method as claimed in claim 16, wherein steps of providing the parameter providing module for providing the supply voltage parameter and the PA input power parameter comprise:

measuring a plurality of output powers and a plurality of output efficiencies of the PA corresponding to various power voltages and the envelope amplitudes of various input signals;

obtaining a comparison formula according to the power voltages, the envelope amplitudes of the input signals, the output powers and the output efficiencies; and calculating a reference voltage and a reference power based on the comparison formula according to the envelope amplitude of the input signal.

19. The control method as claimed in claim 16, wherein after comparing the envelope amplitude of the input signal with the threshold value, the control method further comprises:

when the envelope amplitude of the input signal is less than the threshold value, outputting the PA input signal to the input terminal of the PA according to a magnification;

setting the power terminal of the PA to be a first predetermined supply value; and setting the bias terminal of the PA to be a second predetermined bias.

20. The control method as claimed in claim 19, wherein the first predetermined supply value is the threshold value.

* * * * *